(12) United States Patent
Liu et al.

(10) Patent No.: US 11,302,879 B2
(45) Date of Patent: Apr. 12, 2022

(54) FLEXIBLE DISPLAY SUBSTRATE AND MANUFACTURING METHOD THEREFOR, AND DISPLAY APPARATUS

(71) Applicant: BOE Technology Group Co., Ltd., Beijing (CN)

(72) Inventors: Lu Liu, Beijing (CN); Pao Ming Tsai, Beijing (CN); Peng Cai, Beijing (CN); Hong Li, Beijing (CN); Dejun Bu, Beijing (CN); Jianwei Li, Beijing (CN); Liqiang Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 29 days.

(21) Appl. No.: 16/620,559

(22) PCT Filed: Oct. 12, 2018

(86) PCT No.: PCT/CN2018/109936
§ 371 (c)(1),
(2) Date: Dec. 9, 2019

(87) PCT Pub. No.: WO2019/080718
PCT Pub. Date: May 2, 2019

(65) Prior Publication Data
US 2020/0243779 A1 Jul. 30, 2020

(30) Foreign Application Priority Data
Oct. 26, 2017 (CN) .......................... 201711017792.3

(51) Int. Cl.
*H01L 51/00* (2006.01)
*H01L 51/56* (2006.01)

(52) U.S. Cl.
CPC .......... *H01L 51/0097* (2013.01); *H01L 51/56* (2013.01); *H01L 2251/5338* (2013.01)

(58) Field of Classification Search
CPC combination set(s) only.
See application file for complete search history.

(56) References Cited

U.S. PATENT DOCUMENTS

| 8,815,620 B2 | 8/2014 | Park et al. |
| 10,181,568 B2 | 1/2019 | Lin et al. |

(Continued)

FOREIGN PATENT DOCUMENTS

| CN | 105810102 A | 7/2016 |
| CN | 106684243 A | 5/2017 |

(Continued)

OTHER PUBLICATIONS

Decision of Rejection issued in Chinese Application No. 201711017792.3 dated Nov. 8, 2019.

(Continued)

*Primary Examiner* — Moin M Rahman
(74) *Attorney, Agent, or Firm* — Arent Fox LLP; Michael Fainberg

(57) ABSTRACT

A flexible display substrate and a manufacturing method therefor, and a display apparatus, for relieving the problem that it is difficult to bend the flexible display substrate in a bending region to damage an upper circuit. The flexible display substrate comprises a back film, a first flexible base substrate located above the back film, and a second flexible base substrate located on one side of the first flexible base substrate facing away from the back film. The flexible display substrate has a bending region. An auxiliary layer is further provided between the first flexible base substrate and the second flexible base substrate. At least part of the auxiliary layer in the bending region can be decomposed in a preset condition, wherein the other film layers except the auxiliary layer are maintained at the original status in the preset condition.

13 Claims, 4 Drawing Sheets

(56) References Cited

U.S. PATENT DOCUMENTS

| | | | |
|---|---|---|---|
| 2014/0308804 A1* | 10/2014 | Nishida | H01L 21/02683 |
| | | | 438/487 |
| 2016/0211350 A1 | 7/2016 | Koo et al. | |
| 2017/0047547 A1* | 2/2017 | Son | H01L 25/167 |
| 2017/0271625 A1* | 9/2017 | Liu | H01L 21/76867 |
| 2018/0284523 A1* | 10/2018 | Higano | G02F 1/136286 |
| 2018/0304575 A1 | 10/2018 | Liu et al. | |
| 2019/0081080 A1* | 3/2019 | Xie | H01L 51/5284 |

FOREIGN PATENT DOCUMENTS

| | | |
|---|---|---|
| CN | 107086010 A | 8/2017 |
| CN | 107170778 A | 9/2017 |
| CN | 107768413 A | 3/2018 |

OTHER PUBLICATIONS

Chinese First Office Action issued in Chinese Application No. 201711017792.3 dated Feb. 3, 2019.
Chinese Second Office Action issued in Chinese Application No. 201711017792.3 dated Jul. 22, 2019.

* cited by examiner

FLEXIBLE DISPLAY SUBSTRATE AND MANUFACTURING METHOD THEREFOR, AND DISPLAY APPARATUS

CROSS-REFERENCE TO RELATED APPLICATION

The disclosure is a US National Stage of International Application No. PCT/CN2018/109936, filed on Oct. 12, 2018, which claims priority to a Chinese Patent Application No. 201711017792.3, filed to the Chinese Patent Office on Oct. 26, 2017 and entitled "FLEXIBLE DISPLAY SUBSTRATE AND MANUFACTURING METHOD THEREFOR, AND DISPLAY APPARATUS", the contents of which are incorporated by reference herein in its entirety.

FIELD

The disclosure relates to the technical field of semiconductors, in particular to a flexible display substrate and a manufacturing method therefor, and a display apparatus.

BACKGROUND

In order to enable a flexible display panel to have a narrow bezel, a part in the bezel of the flexible display panel is generally bent to a back face of a display device, which generally requires a part of a film layer in a bending region be removed to reduce bending stress. In a process of removing the part of the film layer, it is liable to cause poor or complicated workmanship and the like.

SUMMARY

An embodiment of the disclosure provides a flexible display substrate having a bending region, the flexible display substrate including:
 a back film;
 a first flexible base substrate, disposed on the back film;
 a second flexible base substrate, disposed on one side of the first flexible base substrate facing away from the back film; and
 an auxiliary layer, disposed between the first flexible base substrate and the second flexible base substrate, where at least part of the auxiliary layer in the bending region is decomposed when satisfying a preset condition, and the other film layers except the auxiliary layer are maintained at the original state in the preset condition.

Optionally, the satisfying a preset condition includes being irradiated by light with a preset wavelength.

Optionally, the auxiliary layer is a non-crystalline silicon layer.

Optionally, the light with a preset wavelength is a laser with a wavelength ranging from 500 nm to 560 nm.

Optionally, a gap is provided between the first flexible base substrate and the second flexible base substrate in the bending region, and the gap is formed by decomposing at least part of the auxiliary layer in the bending region when satisfying the preset condition.

Optionally, the flexible display substrate further includes a stress balancing layer disposed between the auxiliary layer and the second flexible base substrate.

Optionally, the stress balancing layer is a silicon oxide film layer or a silicon nitride film layer.

Optionally, the flexible display substrate has a groove structure in the bending region and the groove structure extends to the auxiliary layer from the back film.

The embodiment of the disclosure further discloses a flexible display apparatus, including the flexible display substrate provided in the embodiment of the disclosure.

The embodiment of the disclosure further discloses a manufacturing method for a flexible display substrate having a bending region, the manufacturing method including:
 forming an auxiliary layer on a first flexible base substrate;
 forming a second flexible base substrate on one side of the auxiliary layer facing away from the first flexible base substrate;
 forming a back film on one side of the first flexible base substrate facing away from the auxiliary layer;
 decomposing at least part of the auxiliary layer in the bending region; and
 removing a back film and a first flexible base substrate in the bending region.

Optionally, the step of decomposing at least part of the auxiliary layer in the bending region specifically includes: irradiating the auxiliary layer in the bending region by light with a preset wavelength.

Optionally, the step of forming an auxiliary layer on a first flexible base substrate specifically includes: forming a non-crystalline silicon layer on the first flexible base substrate.

Optionally, the step of decomposing at least part of the auxiliary layer in the bending region specifically includes: irradiating the non-crystalline silicon layer in the bending region with a laser with a wavelength ranging from 500 nm to 560 nm.

Optionally, the step of removing the back film and the first flexible base substrate in the bending region specifically includes: performing laser cutting along an edge of the gap formed by decomposing the auxiliary layer to cut off the back film and the first flexible base substrate in the bending region.

Optionally, before the step of forming a second flexible base substrate, the manufacturing method further includes: forming a stress balancing layer on one side of the auxiliary layer facing away from the first flexible base substrate.

DETAILED DESCRIPTION OF EMBODIMENTS

Implementation processes in embodiments of the disclosure will be described below in details by combining with accompanying figures of the specification. It needs to note that the same or similar marker from the beginning to the end represents the same or similar element or an element with the same or similar function. Embodiments described below in reference to accompanying figures are exemplary, and used for interpreting the disclosure only, instead of being understood as limitations to the disclosure.

Figure 1:
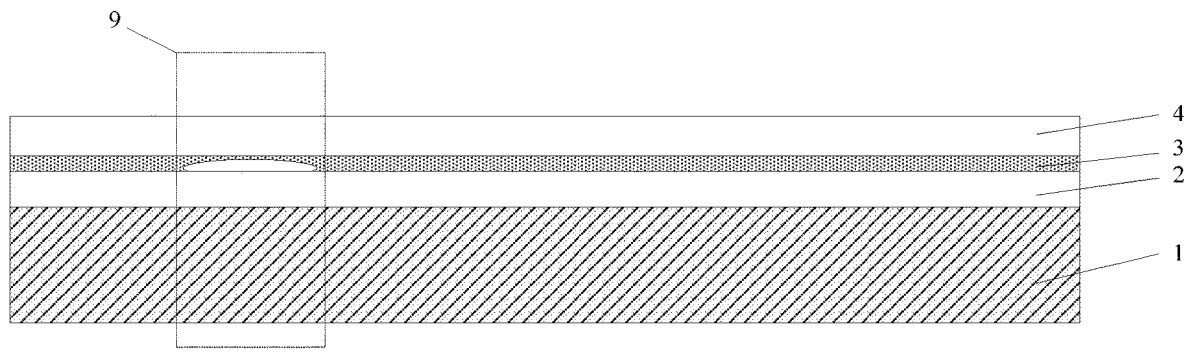
FIG. 1 is a structural schematic diagram of a flexible display substrate provided by some embodiments of the disclosure.

Referring to FIG. 1, an embodiment of the disclosure provides a flexible display substrate having a bending region 9, the flexible display substrate including:

a back film 1;

a first flexible base substrate 2, disposed on the back film 1;

a second flexible base substrate 4, disposed on the side of the first flexible base substrate 2 facing away from the back film 1; and an auxiliary layer 3, disposed between the first flexible base substrate 2 and the second flexible base substrate 4, where at least part of the auxiliary layer 3 in the bending region 9 may be decomposed in a preset condition, and the other film layers except the auxiliary layer 3 are maintained at the original state in the preset condition; that is, when satisfying the preset condition, the auxiliary layer 3 may be decomposed and the other film layers except the auxiliary layer 3, e.g. the back film 1, the first flexible base substrate 2 are not affected, but maintained at the original state.

Specifically, in the above flexible display substrate provided in the embodiment of the disclosure, the auxiliary layer 3 is provided between two layers of base substrates (the first flexible base substrate 2 and the second flexible base substrate 4). The auxiliary layer 3 may be decomposed in the preset condition, such that when the flexible display substrate is bent, the auxiliary layer 3 in the bending region 9 may be firstly decomposed, such that a gap is formed in the bending region 9 between the first flexible base substrate 2 and the auxiliary layer 3. Further, by performing cutting along an edge of the bending region 9, the back film 1 and the first flexible base substrate 2 in the bending region 9 can be removed conveniently, thereby reducing bending stress generated during bending. As such, the technical process for removing a part of a film layer in the bending region can be simplified and the problem that an upper circuit is easily damaged since it is difficult to bend the flexible display substrate having two layers of base substrates in a bending region is relieved.

Optionally, in the above flexible display substrate provided by the embodiment of the disclosure, satisfying a preset condition includes being irradiated by light with a preset wavelength, i.e. at least part of the auxiliary layer 3 in the bending region 9 may be decomposed when being irradiated by the light with a preset wavelength. Alternatively, at least part of the auxiliary layer 3 in the bending region 9 may be decomposed at a preset temperature, that is to say, any processing manner that enables the auxiliary layer 3 to be decomposed while the other film layers except the auxiliary layer 3 to be maintained at the original state may be used as the preset condition of the disclosure. For the auxiliary layer 3, any film layer which can be decomposed in a preset condition may be used as the auxiliary layer 3 of the disclosure.

Optionally, in the above flexible display substrate provided by the embodiment of the disclosure, the material of the auxiliary layer 3 may be non-crystalline silicon, and preset light is a laser with a wavelength ranging from 500 nm to 560 nm.

Optionally, in the above flexible display substrate provided by the embodiment of the disclosure, the first flexible base substrate 2 and the second flexible base substrate 4 may both be polyimide base substrates.

Optionally, in the above flexible display substrate provided by the embodiment of the disclosure, the light with a preset wavelength is a laser with a wavelength of 515 nm.

Since when a green laser with the wavelength of 515 nm irradiates a non-crystalline silicon layer with high hydrogen content, the laser of 515 nm can penetrate a polyimide base substrate and be absorbed by the non-crystalline silicon, such that the non-crystalline silicon can be decomposed. Moreover, when the auxiliary layer 3 is a non-crystalline silicon layer, it facilitates the cutting in the bending region of the flexible display substrate and further plays a packaging role of an inorganic layer in a display region simultaneously.

Figure 2:
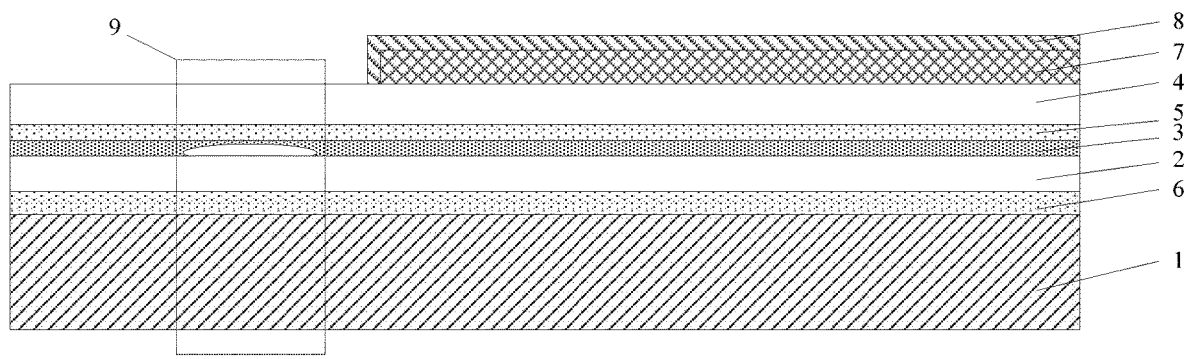
FIG. 2 is a specific structural schematic diagram of a flexible display substrate provided by some embodiments of the disclosure.
Figure 3:
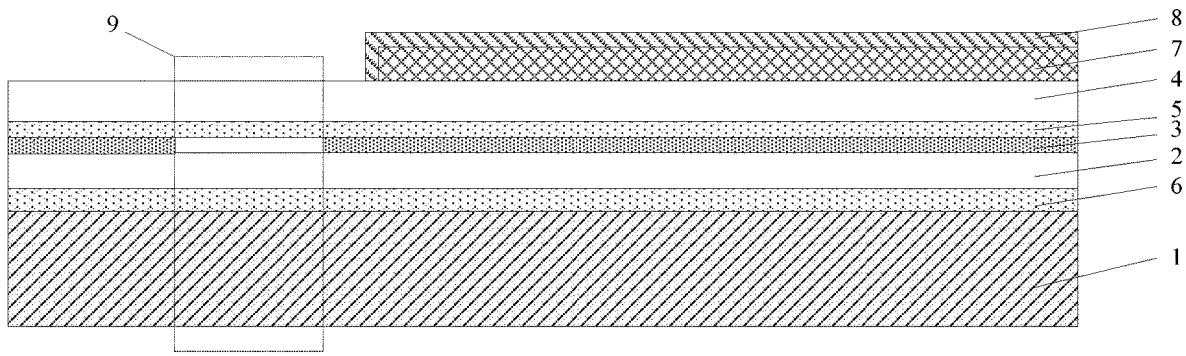
FIG. 3 is a specific structural schematic diagram of a flexible display apparatus provided by some embodiments of the disclosure.

Optionally, in the above flexible display substrate provided by the embodiment of the disclosure, a part of the auxiliary layer 3 in the bending region 9 may be decomposed in the preset condition as shown in FIG. 2; and all of the auxiliary layer 3 in the bending region 9 may also be decomposed in the preset condition as shown in FIG. 3. Specifically, the auxiliary layer 3 may be removed according to a specific actual requirement in a manufacturing process, which is not limited herein.

Optionally, in the above flexible display substrate provided by the embodiment of the disclosure, referring to FIG. 2, the flexible display substrate may further have a stress balancing layer 5 between the auxiliary layer 3 and the second flexible base substrate 4.

Optionally, in the above flexible display substrate provided by the embodiment of the disclosure, the stress balancing layer 5 may be a silicon oxide film layer or a silicon nitride film layer.

Optionally, in the above flexible display substrate provided by the embodiment of the disclosure, a bonding layer 6 may be further provided between the back film 1 and the first flexible base substrate 2, and the back film 1 and the first flexible base substrate 2 are bonded through the bonding layer 6.

Optionally, in the above flexible display substrate provided by the embodiment of the disclosure, the first flexible base substrate 2 and the second flexible base substrate 4 may specifically be polyimide base substrates.

Optionally, in the above flexible display substrate provided by the embodiment of the disclosure, the back film 1 may specifically be polyethylene terephthalate (PET), polyethylene naphthalate two formic acid glycol (PEN), cycloolefin polymer (COP), acrylic and other plastic film layers.

It needs to be interpreted that for the flexible display substrate provided by the embodiment of the disclosure, since the auxiliary layer 3 in the bending region 9 needs to be decomposed firstly, then cutting is performed along an edge of the bending region 9 to cut off the back film 1 and the first flexible base substrate 2 in the bending region 9, and afterwards, the flexible display substrate is bent towards one side of the back film 1 along the bending region 9, different shape structures can be provided at different stages.

Figure 10:
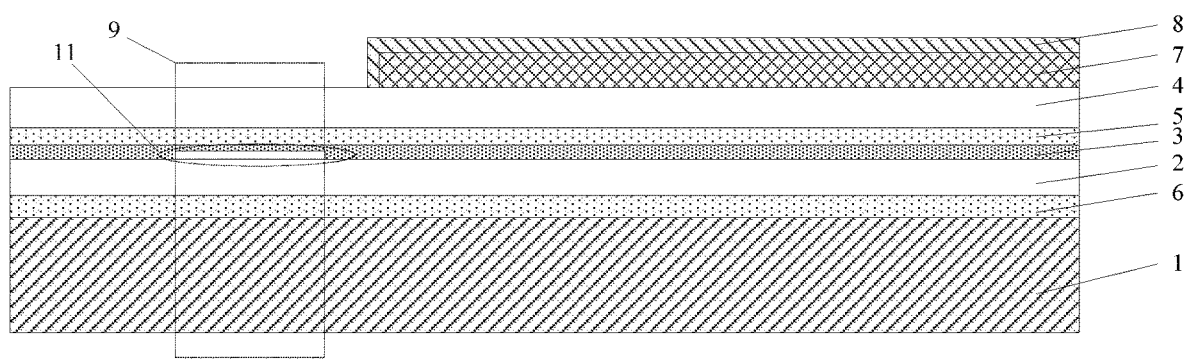
FIG. 10 is a structural schematic diagram of a flexible display substrate with all of the auxiliary layer in a bending region being decomposed provided by some embodiments of the disclosure.

For example, with removing a part of the auxiliary layer 3 in the bending region 9 as an example, referring to FIG. 10, after the auxiliary layer 3 in the bending region 9 is decomposed and before the back film 1 and the first flexible base substrate 2 in the bending region 9 are removed, a gap 11 is provided in the bending region 9 between the first flexible base substrate 2 and the stress balancing layer 5. The gap 11 is formed by decomposing a part of the auxiliary layer 3 in the bending region 9 when satisfying the preset condition.

Figure 11:
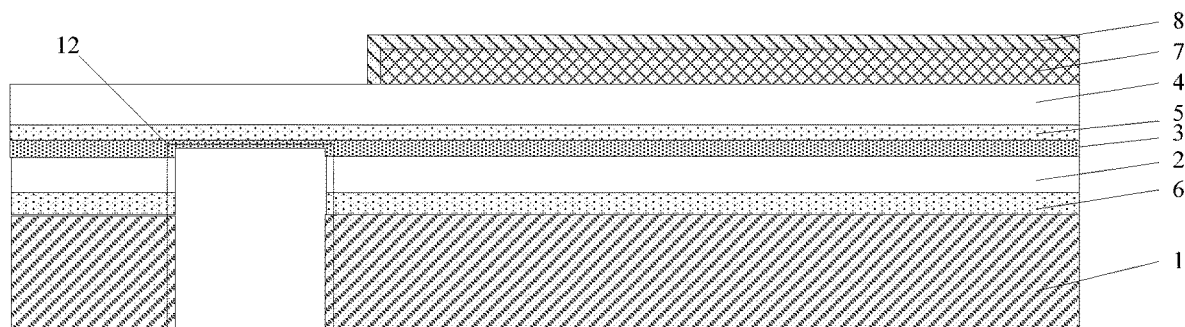
FIG. 11 is a structural schematic diagram of a flexible display substrate with a back film and a first flexible base substrate in a bending region being removed provided by some embodiments of the disclosure.

After the back film 1 and the first flexible base substrate 2 in the bending region 9 are removed and before the flexible display substrate 2 is bent towards one side of the back film 1 along the bending region, the flexible display substrate has a groove structure 12 in the bending region 9, and the groove structure 12 extends to the auxiliary layer 3 from the back film 1, as shown in FIG. 11.

Based on the same inventive concept, the embodiment of the disclosure further provides a flexible display apparatus, including the above flexible display substrate provided by the embodiment of the disclosure.

Figure 4:
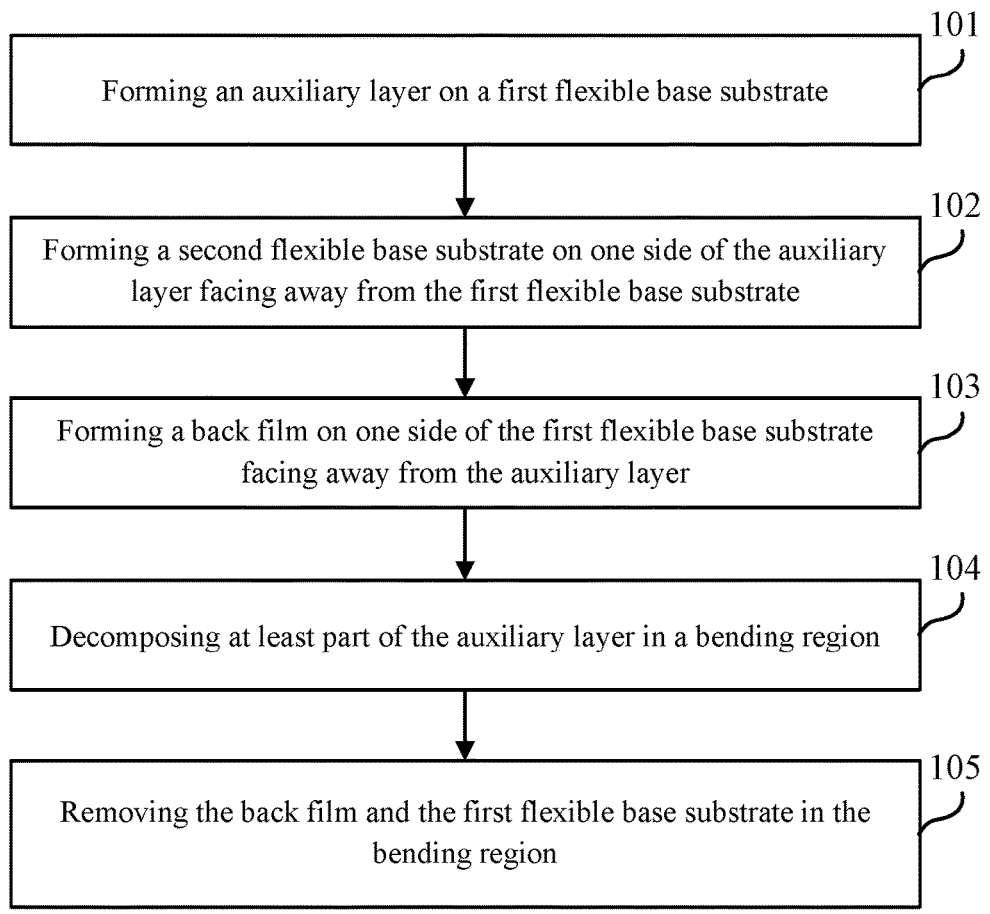
FIG. 4 is a manufacturing flow chart of a flexible display substrate provided by some embodiments of the disclosure.

Based on the same inventive concept, the embodiment of the disclosure further provides a manufacturing method for a flexible display substrate. Referring to FIG. 4, the flexible display substrate has a bending region, and the manufacturing method includes the steps as follows.

Step 101: forming an auxiliary layer on a first flexible base substrate.

Optionally, the step of forming an auxiliary layer on a first flexible base substrate may specifically include: forming a non-crystalline silicon auxiliary layer on a first flexible base substrate.

During specific implementation, before the step of forming an auxiliary layer on a first flexible base substrate, the manufacturing method may further include: forming a first flexible base substrate on a support plate.

Step 102: forming a second flexible base substrate on one side of the auxiliary layer facing away from the first flexible base substrate.

Optionally, before the step of forming a second flexible base substrate on one side of the auxiliary layer facing away from the first flexible base substrate, the manufacturing method may further include: forming a stress balancing layer on one side of the auxiliary layer facing away from the first flexible base substrate.

Specifically, a silicon oxide film layer or a silicon nitride film layer may be formed on one side of the auxiliary layer facing away from the first flexible base substrate.

Step 103: forming a back film on one side of the first flexible base substrate facing away from the auxiliary layer.

During specific implementation, before the step of forming a back film on one side of the first flexible base substrate facing away from the auxiliary layer, the manufacturing method may further include: separating the first flexible base substrate from the support plate.

Further, before the step of separating the first flexible base substrate from the support plate, the manufacturing method may further include: sequentially forming a light emitting layer and a packaging layer on the second flexible base substrate.

Specifically, the light emitting layer may include an anode, an organic electroluminescent material layer and a cathode layer, etc.; and a specific packaging layer may be a film layer with an organic layer and an inorganic layer superposed with each other.

Optionally, the step of forming a back film on one side of the first flexible base substrate facing away from the auxiliary layer may specifically include: forming a bonding layer on one side of the first flexible base substrate facing away from the auxiliary layer, and bonding the back film to the first flexible base substrate through the bonding layer.

Step 104: decomposing at least part of the auxiliary layer in the bending region.

Optionally, the step of decomposing at least part of the auxiliary layer in the bending region may specifically include: irradiating light with a preset wavelength to the auxiliary layer in the bending region.

Optionally, a laser with a wavelength ranging from 500 nm to 560 nm is adopted for irradiating a non-crystalline silicon layer in the bending region.

Step 105: removing the back film and the first flexible base substrate in the bending region.

Optionally, the step of removing the back film and the first flexible base substrate in the bending region may specifically include: performing laser cutting along an edge of the gap formed by decomposing the auxiliary layer to cut off the back film and the first flexible base substrate in the bending region.

For describing the manufacturing method for the flexible display substrate provided in the disclosure in more details, examples are listed as follows by combining with FIGS. 5 to 11.

Figure 5:
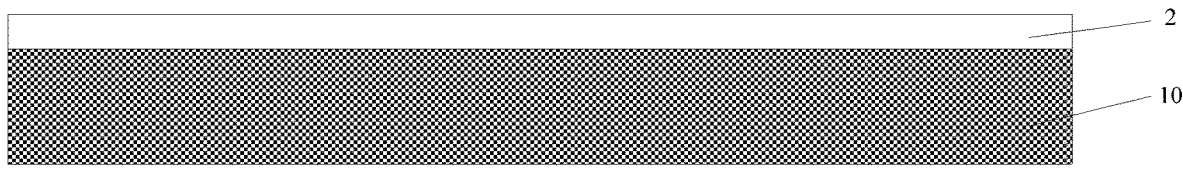
FIG. 5 is a structural schematic diagram in which a first flexible base substrate is manufactured provided by some embodiments of the disclosure.

Step 1: a first flexible base substrate 2 is formed on a support plate 10. A schematic diagram in which a first flexible base substrate 2 is formed on a support plate 10 is shown in FIG. 5.

Figure 6:
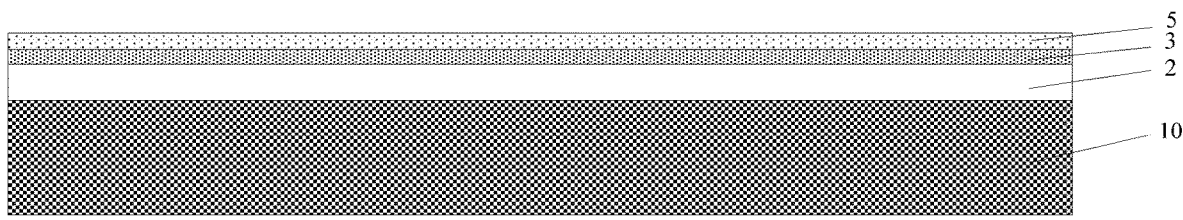
FIG. 6 is a structural schematic diagram in which an auxiliary layer and a stress balancing layer are manufactured provided by some embodiments of the disclosure.

Step 2: an auxiliary layer 3 is formed on the first flexible base substrate 2, where the specific material of the auxiliary layer 3 may be non-crystalline silicon. A schematic diagram in which an auxiliary layer 3 is formed on the first flexible base substrate 2 is shown in FIG. 6.

Step 3: a stress balancing layer 5 is formed on the auxiliary layer 3, where the specific material of the stress balancing layer may be silicon oxide. A schematic diagram in which a stress balancing layer 5 is formed on the auxiliary layer 3 is shown in FIG. 6.

Figure 7:
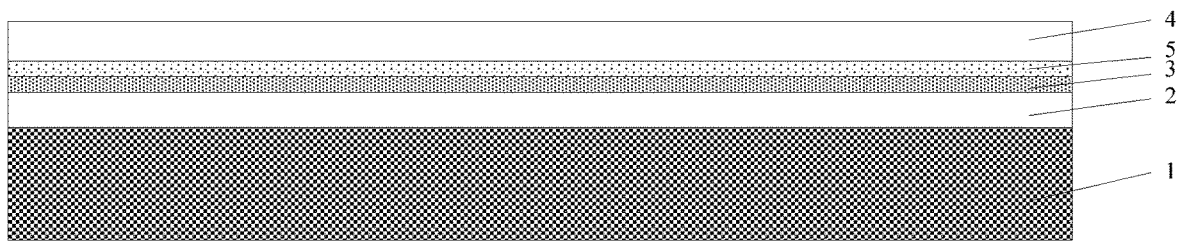
FIG. 7 is a structural schematic diagram in which a second flexible base substrate is manufactured provided by some embodiments of the disclosure.

Step 4: a second flexible base substrate 4 is formed on the auxiliary layer 3. A schematic diagram in which a second flexible base substrate 4 is formed on the auxiliary layer 3 is shown in FIG. 7.

Figure 8:
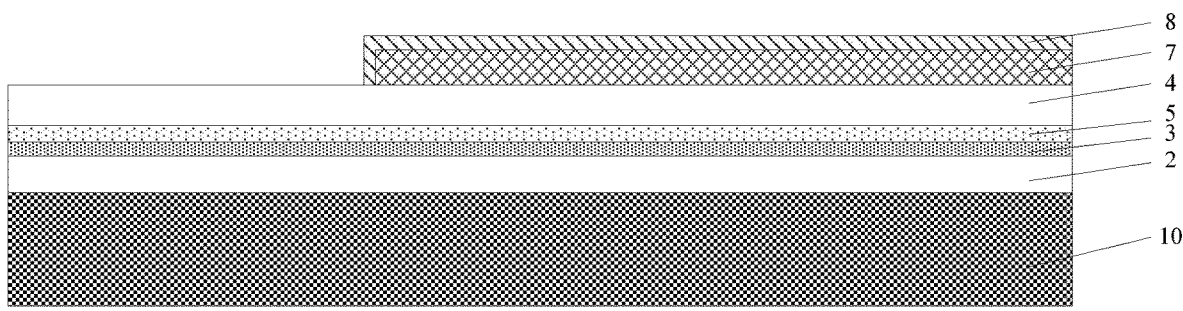
FIG. 8 is a structural schematic diagram in which a light emitting layer and a packaging layer are formed on a second flexible base substrate provided by some embodiments of the disclosure.

Step 5: a light emitting layer 7 and a packaging layer 8 are sequentially formed on the second flexible base substrate 4. A schematic diagram in which a light emitting layer 7 and a packaging layer 8 are sequentially formed on the second flexible base substrate 4 is shown in FIG. 8.

Step 6: the first flexible base substrate 2 is separated from the support plate 10.

Figure 9:
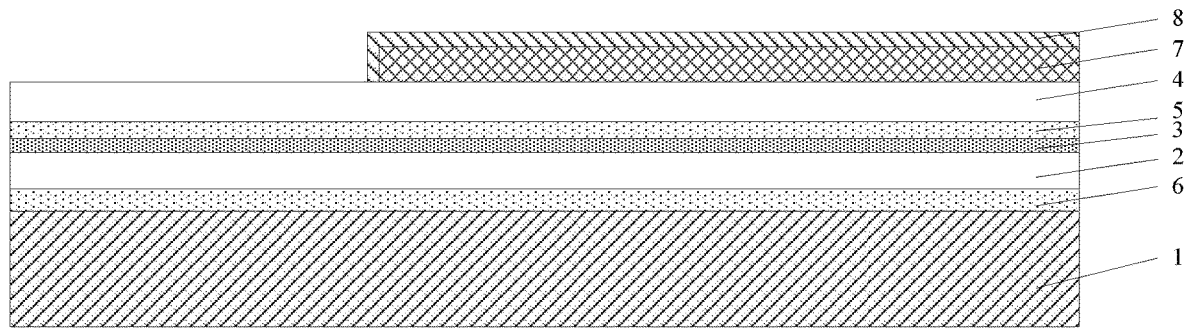
FIG. 9 is a structural schematic diagram in which a back film is formed on one side of a first flexible substrate facing away from an auxiliary layer provided by some embodiments of the disclosure.

Step 7: a bonding layer 6 is formed on one side of the first flexible base substrate 2 facing away from the auxiliary layer 3, and the back film 1 is bonded to the first flexible base substrate 1 through the bonding layer 6. A schematic diagram in which the back film 1 is formed is shown in FIG. 9.

Step 8: a laser with wavelength of 515 nm is used to irradiate the auxiliary layer 3 (the non-crystalline silicon layer) in the bending region 9 to decompose a part of the auxiliary layer 3 (the non-crystalline silicon layer) in the bending region 9, and a gap 11 between the auxiliary layer 3 and the first flexible base substrate 1 is formed. A schematic diagram in which the auxiliary layer 3 in the bending region 9 is decomposed is shown in FIG. 10.

Step 9: cutting is performed along an edge of the bending region 9 on one side of the back film 1 facing away from the first flexible base substrate 2 with a laser cutting technique to cut off the back film 1 and the first flexible base substrate 2 as well as the other film layers between the back film 1 and the first flexible base substrate 2 in the bending region 9 so as to form a groove structure 12. A schematic diagram in which the back film 1 and the first flexible base substrate 2 in the bending region 9 are cut off is shown in FIG. 11.

Step 10: the flexible display substrate is bent towards one side of the back film in the bending region.

The embodiment of the disclosure provides the above flexible display substrate and the manufacturing method therefor, and the display apparatus. The auxiliary layer is provided between two layers of base substrates, and the auxiliary layer may be decomposed in the preset condition. When the flexible display substrate is bent, the auxiliary layer in the bending region may be firstly decomposed, such that a gap is formed in the bending region between the first flexible base substrate and the auxiliary layer. Further, by performing cutting along an edge of the bending region, the back film and the first flexible base substrate in the bending region can be removed conveniently, thereby reducing bending stress generated during bending. As such, the technical process for removing a part of a film layer in the bending region can be simplified, and the problem that that an upper circuit is easily damaged since it is difficult to bend the flexible display substrate having two layers of base substrates in a bending region is relieved.

Obviously, those skilled in the art can make various modifications and deformations to the disclosure, without separating them from the spirit and scope of the disclosure. By doing this, if these modifications and deformations of the disclosure belong to the scope of the claims and equivalent techniques in the disclosure, the disclosure also intends to include these modifications and deformations.

The invention claimed is:

1. A flexible display substrate having a display area and a bezel area, wherein a bending region is provided in the bezel area, and the flexible display substrate comprises:
    a back film;
    a first flexible base substrate, disposed on the back film;
    a second flexible base substrate, disposed on one side of the first flexible base substrate facing away from the back film; and
    an auxiliary layer, disposed between the first flexible base substrate and the second flexible base substrate;
    wherein when light with a preset wavelength is irradiating at the bending region, at least part of the auxiliary layer in the bending region is decomposed; wherein:
        when part of the auxiliary layer in the bending area is decomposed, a first gap is formed between the first flexible base substrate and the auxiliary layer; and
        when all the auxiliary layer in the bending area is decomposed, a second gap is formed between the first flexible base substrate and the second flexible base substrate;
    after the first gap or the second gap is formed, removing the back film and the first flexible base substrate in the bending region.

2. The flexible display substrate of claim 1, wherein the auxiliary layer is a non-crystalline silicon layer.

3. The flexible display substrate of claim 1, wherein the light with the preset wavelength is a laser with a wavelength ranging from 500 nm to 560 nm.

4. The flexible display substrate of claim 1, wherein the flexible display substrate further comprises a stress balancing layer disposed between the auxiliary layer and the second flexible base substrate.

5. The flexible display substrate of claim 4, wherein the stress balancing layer is a silicon oxide film layer or a silicon nitride film layer.

6. The flexible display substrate of claim 1, wherein the flexible display substrate has a groove structure in the bending region, and the groove structure extends to the auxiliary layer from the back film.

7. A flexible display apparatus, wherein the flexible display apparatus comprises the flexible display substrate of claim 1.

8. A manufacturing method for the flexible display substrate of claim 1, wherein the manufacturing method comprises:
    forming the auxiliary layer on the first flexible base substrate;
    forming the second flexible base substrate on one side of the auxiliary layer facing away from the first flexible base substrate; and
    forming the back film on one side of the first flexible base substrate facing away from the auxiliary layer.

9. The manufacturing method of claim 8, further comprising:
    decomposing at least part of the auxiliary layer in the bending region;
    wherein the step of decomposing at least part of the auxiliary layer in the bending region specifically comprises: irradiating the auxiliary layer in the bending region by light with a preset wavelength.

10. The manufacturing method of claim 9, wherein the step of forming an auxiliary layer on a first flexible base substrate specifically comprises: forming a non-crystalline silicon layer on the first flexible base substrate.

11. The manufacturing method of claim 10, wherein the step of decomposing at least part of the auxiliary layer in the bending region specifically comprises: irradiating the non-crystalline silicon layer in the bending region with a laser with a wavelength ranging from 500 nm to 560 nm.

12. The manufacturing method of claim 8, further comprising:
    removing a back film and a first flexible base substrate in the bending region, after decomposing at least part of the auxiliary layer in the bending region;
    wherein the step of removing the back film and the first flexible base substrate in the bending region specifically comprises: performing laser cutting along an edge of the gap formed by decomposing the auxiliary layer to cut off the back film and the first flexible base substrate in the bending region.

13. The manufacturing method of claim 8, wherein before the step of forming a second flexible base substrate, the manufacturing method further comprises: forming a stress balancing layer on one side of the auxiliary layer facing away from the first flexible base substrate.

* * * * *